(12) United States Patent
Holzman

(10) Patent No.: US 8,339,170 B1
(45) Date of Patent: Dec. 25, 2012

(54) LATCHING SIGNAL GENERATOR

(75) Inventor: Uri Holzman, Kfar-Saba (IL)

(73) Assignee: Marvell Israel (M.I.S.L.) Ltd., Yokneam (IL)

( * ) Notice: Subject to any disclaimer, the term of this patent is extended or adjusted under 35 U.S.C. 154(b) by 195 days.

(21) Appl. No.: 12/963,420

(22) Filed: Dec. 8, 2010

Related U.S. Application Data

(60) Provisional application No. 61/267,759, filed on Dec. 8, 2009.

(51) Int. Cl.
*H03K 3/02* (2006.01)
(52) U.S. Cl. ........................................ 327/185; 327/199
(58) Field of Classification Search .................. None
See application file for complete search history.

(56) References Cited

U.S. PATENT DOCUMENTS

| | | | | |
|---|---|---|---|---|
| 5,881,002 A | * | 3/1999 | Hamakawa | 365/195 |
| 5,886,553 A | * | 3/1999 | Matsui | 327/166 |
| 6,404,260 B1 | * | 6/2002 | Cruz-Albrecht | 327/299 |
| 6,674,666 B2 | * | 1/2004 | Maone et al. | 365/185.21 |
| 7,403,446 B1 | * | 7/2008 | Parameswaran et al. | 365/233.1 |
| 7,688,640 B2 | * | 3/2010 | Kang | 365/185.23 |
| 7,719,527 B2 | * | 5/2010 | Lu | 345/204 |

OTHER PUBLICATIONS

U.S. Appl. No. 13/216,863, filed Aug. 24, 2011, Bazes, Mel.
Klass, Fabian, "Semi-Dynamic and Dynamic Flip-Flops with Embedded Logic", IEEE, 1998 Symposium on VLSI Circuits Digest of Technical Papers, Jun. 1998, pp. 108-109.

\* cited by examiner

*Primary Examiner* — Cassandra Cox

(57) ABSTRACT

Some of the embodiments of the present disclosure provide a latching signal generator, comprising a plurality of inputs configured to receive a clock signal, latch input data, and latch data, wherein the latch input data and the latch data are associated with a latch and wherein the latching signal generator is configured; to provide a latching signal to a latch; and a determination circuit that is configured to cause the latching signal generator to provide the latching signal based on during an active cycle of the clock signal, in response to a determination that the input latch data is different than the latch data. Other embodiments are also described and claimed.

20 Claims, 5 Drawing Sheets

LATCHING SIGNAL GENERATOR

CROSS REFERENCE TO RELATED APPLICATIONS

This Application claims priority to Provisional Application No. 61/267,758, entitled "Race Safe Pulsed Latch," the entire specification of which is hereby incorporated by reference, except for those sections, if any, that are inconsistent with this disclosure.

TECHNICAL FIELD

Embodiments herein relate to the field of digital circuitry, and, more specifically, to latches.

BACKGROUND

The background provided herein is for the purpose of generally presenting the context of this disclosure. Work of the presently named inventor, to the extent it is described in this background section, as well as aspects of the description that may not otherwise qualify as prior art at the time of filing, are neither expressly nor impliedly admitted as prior art against the present disclosure.

Integrated circuit devices include multiple components which, when operating together, perform desired functions. The design of the circuit devices involves consideration of a wide range of factors. These factors include, among others, power dissipation of each of the components within the device, the physical area that each of these components occupy, and the speed of the components.

One component which generally exists within integrated circuit devices is a data latch. A data latch is a component which stores data, typically one bit, for a period of time. The period of time that the data is stored is determined by a latching signal (e.g., a clock signal). When latches are implemented as flip flop devices, for example, they typically have various drawbacks including, but not limited to, race conditions and unnecessary dissipation of power.

SUMMARY

In various embodiments, the present disclosure provides a latching signal generator, comprising a plurality of inputs configured to receive a clock signal, latch input data, and latch data, wherein the latch input data and the latch data are associated with a latch; a signal module configured to provide a latching signal to a latch; and a determination circuit that is configured to cause the signal module to provide the latching signal based on during an active cycle of the clock signal, in response to a determination that the input latch data is different than the latch data.

There is also provided a latching system, comprising a latch for storing latch data, wherein the latch is configured to change state based on receipt of a latching signal; and a latching signal generator coupled to the latch, wherein the latching signal generator is configured to receive a clock signal and provide the latching signal to the latch during an active cycle of the clock signal based on a determination that the latch data is different than latch input data.

There is also provided a method, comprising receiving, by a latching signal generator, a clock signal, latch input data, and latch data, wherein the latch input data is an input to a latch and the latch data is stored in the latch; determining, by the latching signal generator and in response to the clock signal, whether to change a state of the latch based on the latch input data and the latch data; and controlling, by the latching signal generator, the latch based on the determination.

BRIEF DESCRIPTION OF THE DRAWINGS

Embodiments will be readily understood by the following detailed description in conjunction with the accompanying drawings. Embodiments are illustrated by way of example and not by way of limitation in the figures of the accompanying drawings.

DETAILED DESCRIPTION OF DISCLOSED EMBODIMENTS

In the following detailed description, reference is made to the accompanying drawings which form a part hereof, and in which are shown, by way of illustration, embodiments that may be practiced. It is noted that other embodiments may be utilized and structural or logical changes may be made without departing from the scope of the present disclosure. Therefore, the following detailed description is not to be taken in a limiting sense, and the scope of embodiments is defined by the appended claims and their equivalents.

Various operations may be described as multiple discrete operations in turn, in a manner that may be helpful in understanding embodiments; however, the order of description should not be construed to imply that these operations are order dependent. Additionally, the description should not be construed to imply that all operations are necessary for all embodiments.

As used herein, the term "coupled" means that two or more elements are in direct physical or electrical contact, and may also mean that two or more elements are not in direct contact with each other, but yet still cooperate or interact with each other.

The description may use the terms "embodiment" or "embodiments," which may each refer to one or more of the same or different embodiments. Furthermore, the terms "comprising," "including," "having," and the like, as used with respect to embodiments, are synonymous.

In various embodiments, a race-safe pulsed latch apparatus, system, an integrated circuit including the system, and associated method are provided. A latching signal generator of the system is configured to generate latching signals for the latch only when the latch is required to switch states. The latching signal generator determines whether the latch is to switch states via a comparison of the latch data (e.g., data being stored by the latch) with latch input data (e.g., data going into the latch). In an embodiment, when the latch input data does not match the latch data, the latching signal is activated (e.g., is provided to the latch by the latching signal generator), based on which the latch switches its state. On the other hand, in an embodiment when the latch input data matches the latch data, the latch is not required to switch states and the latching signal is terminated or otherwise suppressed. By suppressing the latching signals when the latch is in an appropriate state, unnecessary power dissipation is reduced.

Additionally, by monitoring both the latch data and the latch input data, the latching signal can be closed (e.g., suppressed from being provided to the latch) when the latch has changed states. Consequently, the closing of the latching signal can be independent of the clock signal. In an embodiment, this alleviates race conditions. In various embodiments, a computing system is endowed, for example, with one or more components of the disclosed apparatuses and/or systems and is employed to perform one or more methods as disclosed herein.

Figure 1:
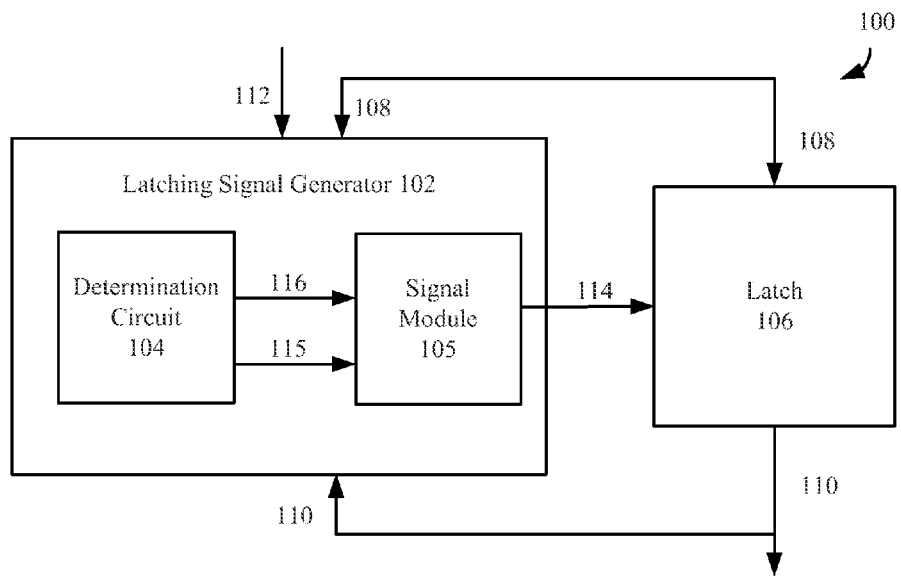
FIG. 1 illustrates a latching system in accordance with various embodiments.

Referring to FIG. 1, a latching system 100 is illustrated in accordance with various embodiments. The latching system 100 includes a latch 106 coupled to a latching signal generator 102. The latch 106 is configured to store data and change states based on a latching signal 114. The latching signal generator 102 further includes a determination circuit 104 and a signal module 105 coupled to the determination circuit 104. The latching signal generator 102 receives a plurality of inputs 112, 108, and 110, and based on those inputs, is configured to selectively generate and provide a latching signal 114 to the latch 106. In an embodiment, the signal module 105 is configured to provide the latching signal 114 to the latch 106, while the determination circuit 104 is configured to receive the plurality of inputs 112, 108, and 110 and to cause the signal module 105 to provide the latching signal 114 to the latch 106. In an embodiment, the determination circuit 104 generates a non-inverted output 115 and an inverted output 116, based on which the signal module 105 generates the latching signal 114. Alternatively, in an embodiment signal generator 102 is configured to provide only a single output, typically the inverted output 116, and signal module 105 is configured to pass through the inverted output 116 as latching signal 114. In another optional configuration (not shown), signal module 105 receives the inverted output 116, which in this case corresponds to latching signal 114 of the signal generator 102, and then provides both a non-inverted output 115 and an inverted output 116 to latch 106. It is thus noted that latching signal generator 102 and signal module 105 may be each configured to provide various suitable latching signal outputs to latch 106. While only one latch 106 is illustrated, it is noted that more than one latch 106 can be coupled to the latching signal generator 102 without deviating from the scope of the present disclosure.

The latching signal generator 102 (e.g., the determination circuit 104) receives a clock signal 112, latch input data 108 associated with the latch 106, and latch data 110 currently being stored by the latch 106. The determination circuit 104 is configured to determine whether the latch input data 108 is equivalent to the latch data 110. This determination serves as the basis for whether the latching signal generator 102 provides the latching signal 114 to the latch 106. The latching signal 114 indicates when the latch is available to receive input date, and when the latch is not available to receive input data. In an embodiment, the determination circuit 104 causes the signal module 105 to generate the latching signal 114. It is noted that a determination may be defined merely as the response of the latching signal generator 102 in response to receipt of one or more signals.

The latching signal generator 102 is configured to provide the latching signal 114 to the latch 106 during an active cycle of the clock signal 112 based on a determination that the latch data 110 is different than the latch input data 108. Additionally, the latching signal generator 102 is configured to terminate the latching signal 114 during an active cycle of the clock signal 112 based on a determination that the latch data 110 is equivalent to the latch input data 108. In other words the latching signal is terminated once it is determined that data has been input to the latch. In various embodiments, the latching signal generator 102 suppresses the latching signal by not transmitting the latching signal 114 as long as the latch data 110 is equivalent to the latch input data 108. By terminating the latch signal, and then by not transmitting a subsequent latching signal 114, the latch is not available to receive new input data until new data needs to be input to the latch. Inasmuch as the latch is not available to receive new input data, various components of the latch 106 are not activated, thereby causing the latch to remain in a low powered state which reduces power consumption of the latching system 100.

In various embodiments, configuration of the latching signal 114 is based at least in part on a configuration of the latch 106. For example, in various embodiments, the latching signal 114 comprises both the output 115 and the output 116. In these embodiments, the signal module 105 merely transmits the output 115 and the output 116 from the determination circuit 104 to the latch 106. In various other embodiments, the latching signal 114 comprises only one of the output 115 and the output 116, and the signal module 105 generates both a non-inverted and an inverted output corresponding to latching signal 114. Signals 115 and 116 thus may generated in latching signal generator 102, or in latch 106 based on a single output 114 of latching signal generator, or in a module that is external to both latching signal generator 102 and latch 106. In some of these embodiments, for example, the signal module 105 only receives one of output 115 and output 116, which it then passes as latching signal 114. In another embodiment, for example, signal module 105 selectively multiplexes one of the output 115 and the output 116, received from the determination circuit 104, to the latch 106. In yet other embodiments, the signal module 105 suitably processes the output 115 and the output 116 to generate the latching signal 114.

As will be described in more detail with respect to FIG. 2, to which reference is made, the latching signal generator 102 comprises a plurality of transistors configured to couple an enable node 122 to a low voltage (e.g., a ground voltage) based on a determination that the latch data 110 is the same as the latch input data 108. The transistors are further configured to couple an output 115 of the latching signal generator 102 to a high voltage (e.g., $V_{CC}$) based on a determination that the latch input data 108 is the same as the latch data 110. The high voltage may be translated, via an inverter 118, to a low voltage, wherein the low voltage acts to suppress the latching signal 114 via output 116.

In various embodiments, various components of the latching system 100 experience reduced power consumption because of the suppression of the latching control signals 114. For example, based on a suppression of the latching control signal 114, one or more components of the latching system 100 (e.g., the latching signal generator module 102) are not required to be unnecessarily active. This results in a decrease of consumed power.

Referring again to FIG. 2, a latching signal generator 102 is illustrated in accordance with various embodiments. The latching signal generator 102 includes a plurality of inputs 108-112, a plurality of transistors Q1-Q10, and inverters 118-119, which comprise the determination circuit 104. Additionally, the latching signal generator 102 includes a non-inverted output 115 and an inverted output 116.

The latching signal generator 102 includes a plurality of transistors. In various embodiments the transistors are suitably PMOS transistors, NMOS transistors, and/or any other suitably configured transistor. In the embodiment of FIG. 2, the plurality of inputs 108-112 to the latching signal generator 102 are coupled to the gates of various transistors Q1-Q6 and Q10 as illustrated. A clock signal 112 is coupled to the gate of transistors Q1, Q4, and Q10; latch input data 108 is coupled to the gate of transistor Q2; and the latch data 110 is coupled to the gate of transistor Q3. Additionally, in the embodiment seen, an inverted version 109 of the latch input data 108 and an inverted version 111 of the latch data 110, respectively, are similarly provided to the latching signal generator 102. The inverted versions may be generated by the latching signal generator 102, or alternatively, by another device (not illustrated). The inverted latch input data signal 109 is coupled to the gate of transistor Q5, and the inverted latch data 111 is coupled to the gate of transistor Q6. The inputs 108-111 may be received directly from the latch, or alternatively, may be received from downstream nodes modified by one or more buffers or inverters (not illustrated). By receiving the signals from downstream nodes, noise can be reduced on the circuit.

The determination circuit 104 comprises a plurality of transistors Q2-Q6, which receive the plurality of inputs 108-111. The arrangement of the transistors Q2-Q6 is configured to enable the latching signal generator 102 to determine whether the latching input data 108 is equivalent to the latch data 110. Equivalent data, in various embodiments, is defined in a manner such that the voltage level of the latch input data 108 is substantially similar to the voltage level of the latch data 110. Thus, if the latch data is a "1" and the input latch data is a "1", the latch data and the latch input data are equivalent. In contrast, if the latch data is a "1" and the latch input data is a "0" or the latch data is a "0" and the latch input data is a "1", the latch data and the latch input data are not equivalent.

The latching signal generator 102 (e.g., the signal module 105) is configured to provide a latching signal 114 to the latch 106 during an active cycle of the clock signal 112, in response to a determination (e.g., determination performed by the determination circuit 104) that the input latch data 108 is different than the latch data 110. As previously discussed, the latching signal 114 is based at least in part one or more of the outputs 115 and 116. Additionally, the latching signal generator 102 (e.g., the signal module 105) is further configured to terminate the latching signal once the input latch data 108 is the same as the latch data 110, and then to suppress the latching signal 114 to the latch 106 during an active cycle of the clock signal in response to a determination (e.g., determination performed by the determination circuit 104) that the input latch data 108 is the same as the latch data 110.

Figure 3:
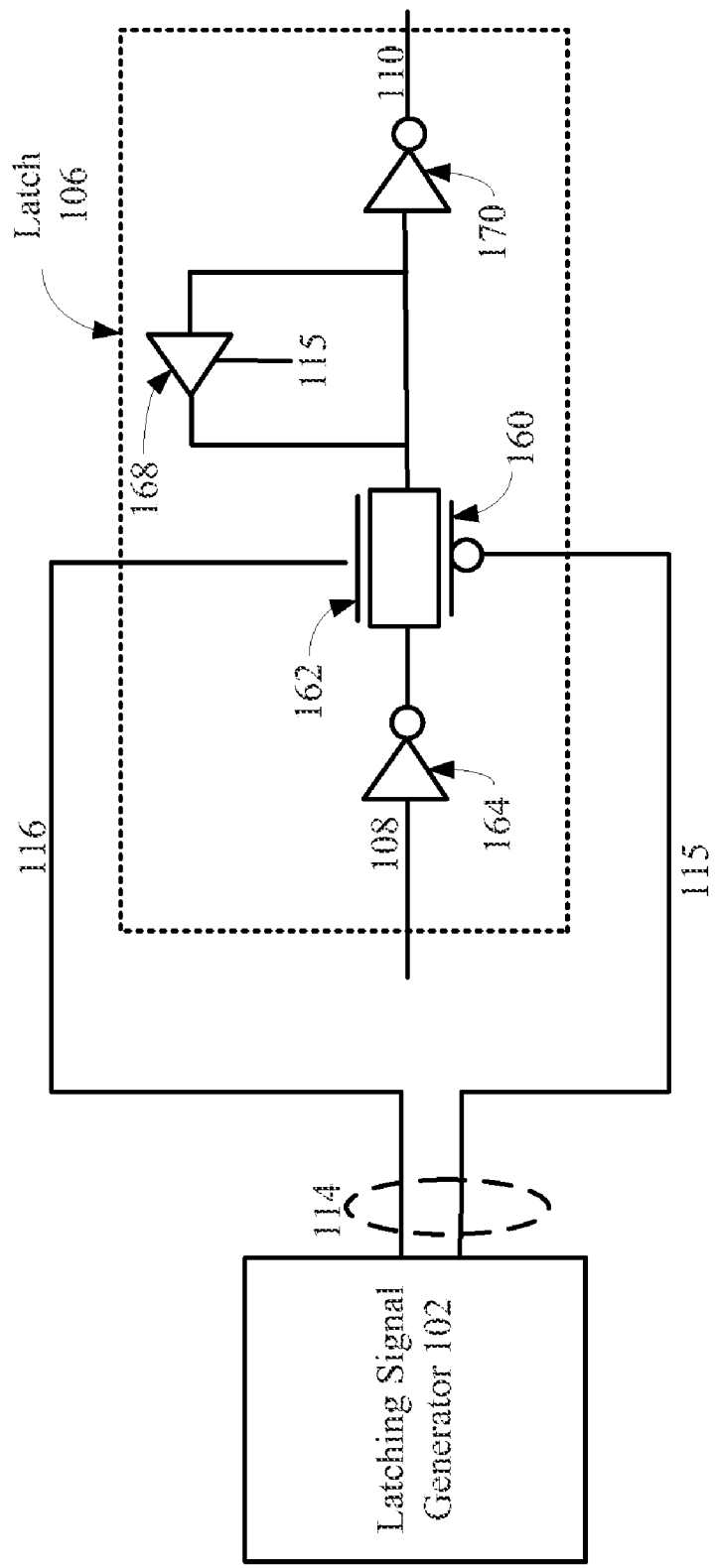
FIG. 3 illustrates a latch configured to receive a latching signal from a latching signal generator of FIG. 2, in accordance with various embodiments.

FIG. 3 illustrates the latch 106 configured to receive the latching signal 114 from the latching signal generator 102 of FIG. 1, in accordance with various embodiments. In the embodiments of FIG. 3, the latching signal 114 comprises the output 115 and the output 116 (e.g., in some of these embodiments, the signal module 105 re-transmits the output 115 and the output 116 from the determination circuit 104 to the latch 106). The latch 106 receives the latch input data 108 and outputs the latch data 110. In another embodiment, latching signal generator 102 generates latching signal 114 as a single output, and inverted and non-inverted compliments of latching signal 114 are generated internally within latch 106.

In the latch 106 of FIG. 3, an input transmission gate, comprised of transistors 160 and 162, receives latch input data 108 through an input inverter 164. In various embodiments, the transistor 160 is controlled by the output 115, while the transistor 162 is controlled by the output 116. In various embodiments, the transistor 160 is a PMOS transistor and the transistor 162 is an NMOS transistor. The input transmission gate samples the received data (e.g., received from the inverter 164) when the output 116 is active. A tristate or non-inverting tristate buffer 168 forms a keeper circuit and is controlled by the output 115. For example, the tristate or non-inverting tristate buffer 168 outputs data when the output 115 is active. The latch data 110 is output through an output inverter 170.

FIG. 3 is an example implementation of the latch 106, and in various other embodiments, the latch 106 may be implemented in any other appropriate manner and/or may be configured to receive and process the latching signal 114 in any other appropriate manner.

Figure 2:
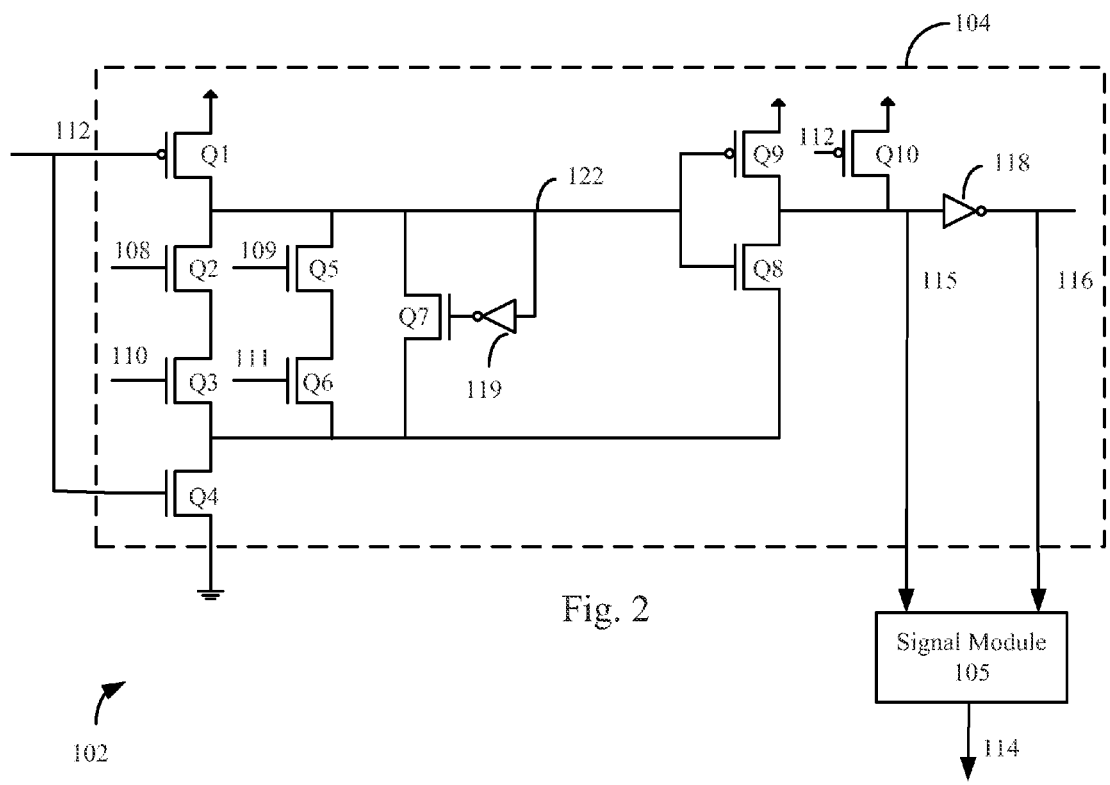
FIG. 2 illustrates a latching signal generator in accordance with various embodiments.
Figure 4:
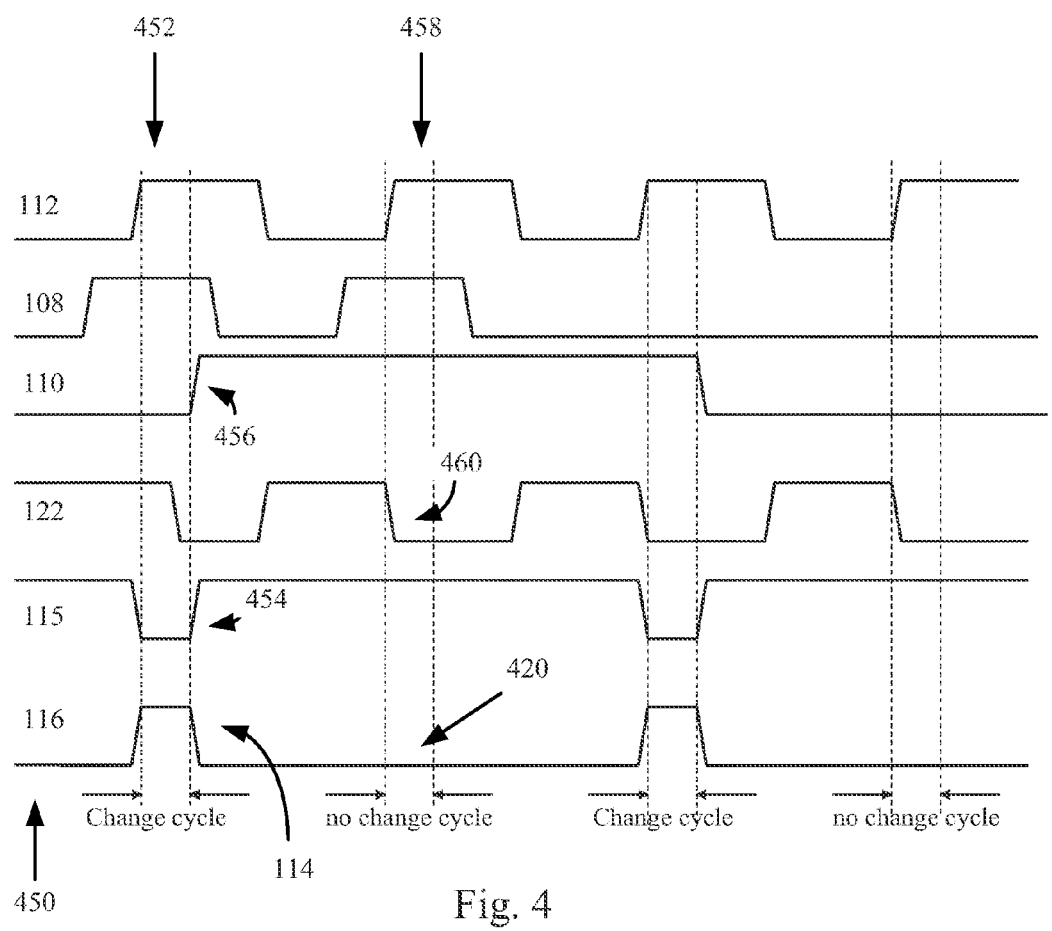
FIG. 4 illustrates a signal diagram in accordance with various embodiments.

Referring to FIGS. 2 and 3, and the signal diagram of FIG. 4, various states of a latch 106 and a latching signal generator 102 are illustrated. In an initial state 450, the clock cycle 112 is low. Consequently, the PMOS transistors Q1 and Q10 effectively couple both node 122 and the non-inverted output 115 to a high voltage, $V_{CC}$. This high voltage acts as a precharge voltage for the node 122 and/or the non-inverted output 115.

When the clock signal 112 goes high or active at 452 (e.g., at a rising edge of the clock signal 112), the PMOS transistors Q1 and Q10 open and $V_{CC}$ is disconnected. At the same time, NMOS transistor Q4 turns on and provides a path to a ground voltage. In the example seen, during the first clock cycle 452 the latch input data 108 is high and the latch data 110 is low. Consequently, the latch input data 108 is not equivalent to the latch data 110. The high latch input data 108 turns on NMOS transistor Q2 while the low latch data 110 does not turn on NMOS transistor Q3. Additionally, it is noted that the opposite occurs for the inverted versions: Q5 is turned off and Q6 is turned on. The disparity between the latch input data 108 and the latch data 110 prevents the pre-charged node 122 from coupling to ground. Because node 122 remains high, transistor Q8 is turned on. The turned on transistor Q4 effectively couples non-inverted output 115, which was previously precharged, to ground via transistor Q4. Consequently, output 115 is dragged low as seen at 454. The inverter then inverts the low signal, which provides a high signal at output 116. In an embodiment, based on the low value of the output 115 and/or the high value of the output 116, the signal module 105 provides the latching signal 114 to the latch.

As the latch 106 changes state 456, or in other words, as the latch data 110 changes to the state of the latch input data 108, the determination circuit 104 closes the latching signal 114 (e.g., suppresses the latching signal 114 to the latch 106). When the latch data 110 is the same as the latch input data 108, the transistors Q2 and Q3, or conversely Q5 and Q6, short node 122 to ground. This triggers the PMOS transistor Q9 to turn on and NMOS transistor Q8 to turn off. Transistor Q9 then couples non-inverted output 115 to $V_{CC}$. As the non-inverted output 115 goes high, the inverter 118 pulls the inverted output 116 low. In an embodiment, based on the high value of the output 115 and/or the low value of the output 116, the signal module 105 suppresses the latching signal 114 to the latch. Consequently, the latching signal generator 102 is further configured to determine that the latch output data 110 has changed state based on the latch input data 108, and in response to the determination, to close the latching signal 114.

Still with reference to FIG. 4, the latch input data 108 and the latch data 110 are equivalent during a second clock cycle 458. The latch input data 108 is high, and the latch data 110 is also high. When the clock signal goes active, the PMOS transistors Q1 and Q10, again decouple the node 122 and non-inverted output 115 from $V_{CC}$. At the same time, the high clock signal 112 turns on NMOS transistor Q4 and provides a path to a ground voltage. During this active cycle of the clock signal 112, the latch input data 108 is high, which turns on NMOS transistor Q2, and the latch data 110 is high, which turns on NMOS transistor Q3. Having transistors Q2-Q4 turned on effectively couples node 122 to a ground voltage 460. The ground voltage turns on PMOS transistor Q9, which in turn couples non-inverted output 115 to $V_{CC}$. Through the inverter 118, the inverted output 116 is kept low and the latching signal 114 is effectively suppressed 420. Although FIG. 2 illustrates an example latching signal generator 102, in various other embodiments, any other suitable circuitry and/or inputs may be used to compare the latch input data 108 to the latch data 110, and to generate the latching signal 114 accordingly.

Figure 5:
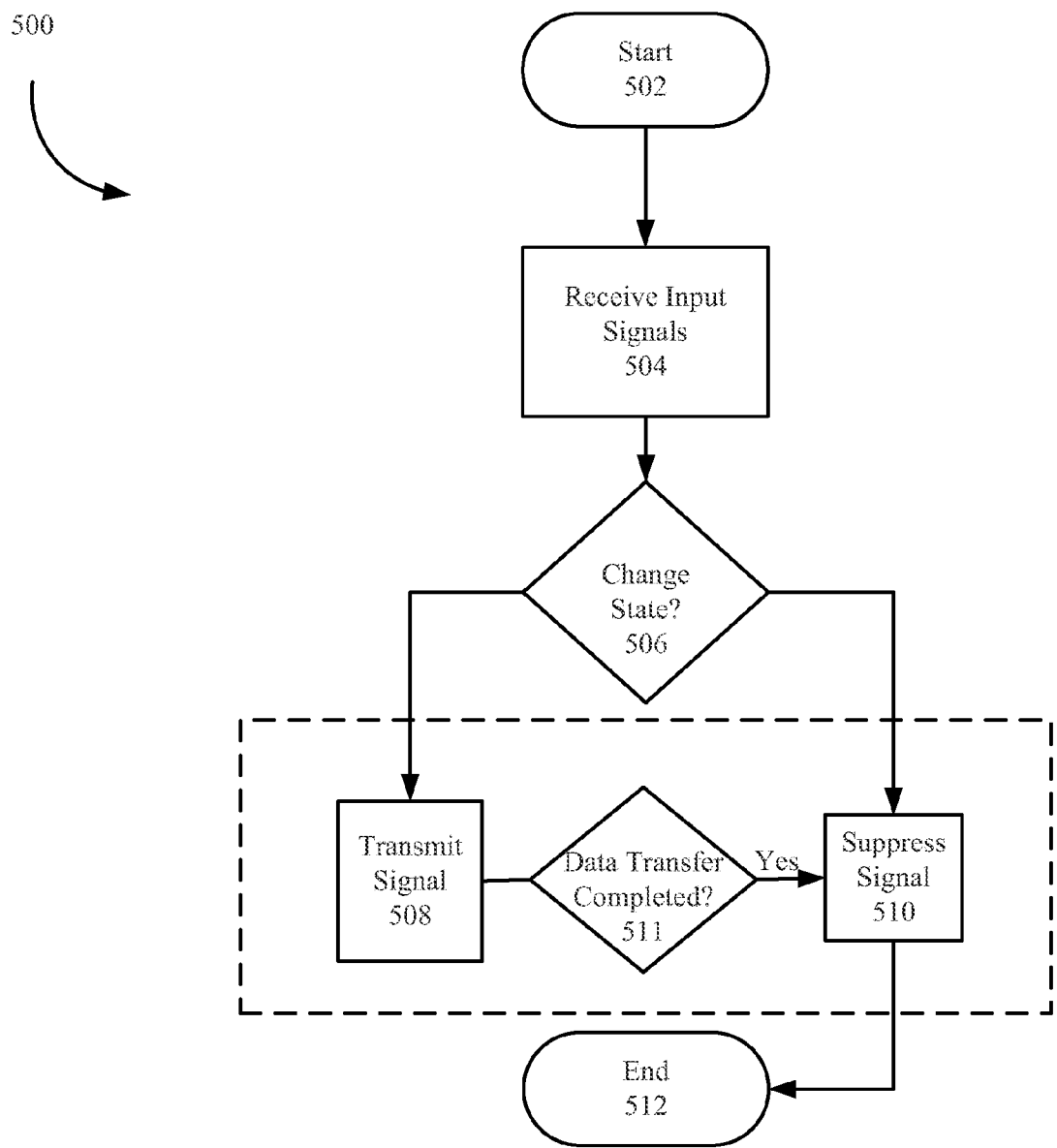
FIG. 5 illustrates a flow diagram in accordance with various embodiments.

Referring to FIG. 5, a flow diagram is illustrated in accordance with various embodiments. Although a particular order of actions is illustrated, one or more actions may be performed in other temporal sequences. The example process is merely provided and described in conjunction with the apparatus of FIGS. 1-2 and 4. The methods described herein are not limited in this regard.

The method 500 begins at 502 and progresses to 504 where the latching signal generator 102 receives a plurality inputs including a clock signal 112, latch input data 108, and latch data 110. The latch input data 108 and the latch data 110 are both associated with latch 106. In addition, in an embodiment, the latching signal generator 102 may also receive inverted signals such as an inverted input latch data 109 and inverted latch data 111, as illustrated in FIG. 2.

At 506, the latching signal generator 102, via a determination circuit 104, may determine whether the latch input data 108 is equivalent to the latch data 110. The determination serves as a basis for controlling the latch 106 during an active cycle of the clock signal 112. If the latching signal generator 102 determines that the latch input data 108 is not equivalent to the latch data 110, the latching signal generator 102 transmits a latching signal 114 at 508. Alternatively, if the latching signal generator 102 determines that the latch input data 108 is equivalent to the latch data 110, the latching signal generator 102 suppresses the latching signal 114 at 510. At 511, subsequent to a latching signal 114, the latching signal generator 102, via the determination circuit 104, may determine that the latch data 110 has become equivalent to the latch input data 108, in other words that input data has transferred to the latch, and terminate latching signal 114. Subsequent to controlling the latch 106, the method 500 may end at 512 and repeat as necessary.

Figure 6:
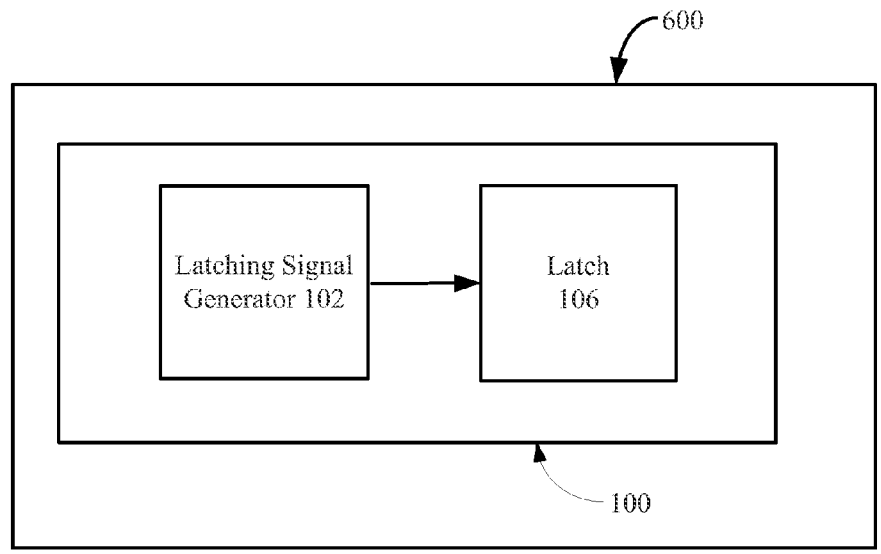
FIGS. 6 and 7 illustrate integrated circuits that include the latching system of FIG. 1 in accordance with various embodiments.

FIG. 6 illustrates an integrated circuit 600 that includes the latching system 100 of FIG. 1. In various embodiments, the latching system 100 (e.g., the latching signal generator 102 and the latch 106) in the integrated circuit 600 is a part of and/or acts as, for example, a logic circuit, a flip flop, and/or the like. For example, in an embodiment and although not illustrated in FIG. 6, a logic circuit comprises a plurality of latching systems, one or more of which are similar to the latching systems 100. Although not illustrated in FIG. 6, the integrated circuit 600 includes one or more other components (e.g., a processing module, a data bus, a logic circuit, one or more peripherals, etc.).

Figure 7:
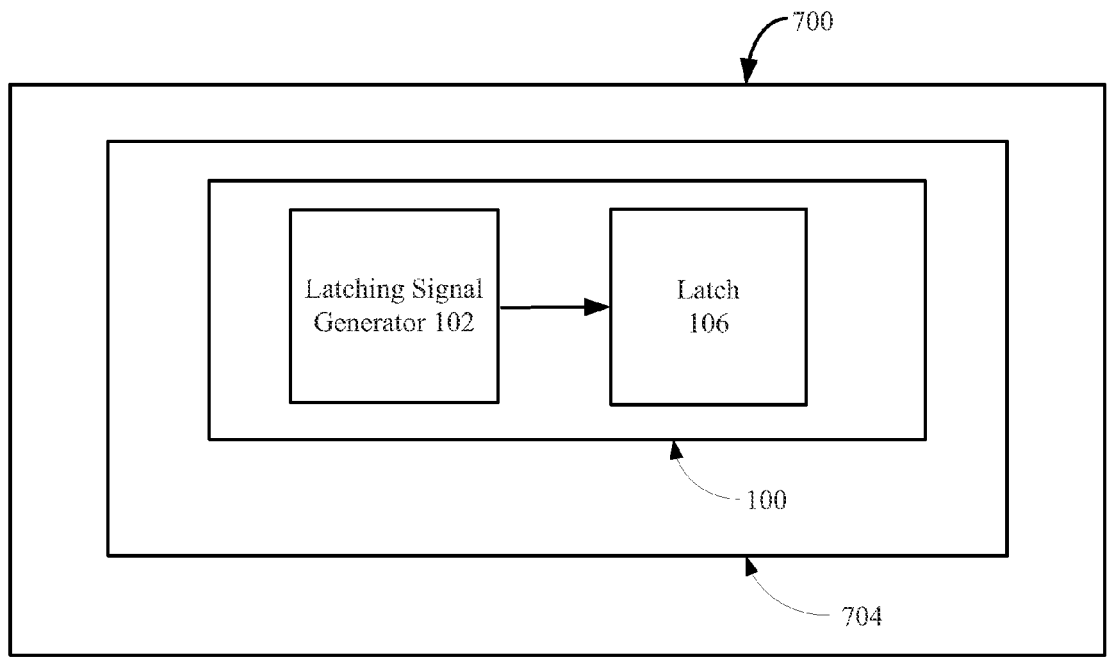

FIG. 7 illustrates an integrated circuit 700 that includes a flip flop 704 comprising the latching system 100 of FIG. 1. In various embodiments, the flip flop 704 includes a plurality of latching systems (e.g., two latching systems), including the latching system 100. Although not illustrated in FIG. 7, the integrated circuit 700 includes one or more other components (e.g., a processing module, a data bus, a logic circuit, one or more peripherals, etc.).

Although certain embodiments have been illustrated and described herein, it will be appreciated by those of ordinary skill in the art that a wide variety of alternate and/or equivalent embodiments or implementations calculated to achieve the same purposes may be substituted for the embodiments shown and described without departing from the scope. Those with skill in the art will readily appreciate that embodiments may be implemented in a very wide variety of ways. This application is intended to cover any adaptations or variations of the embodiments discussed herein. Therefore, it is manifestly intended that embodiments be limited only by the claims and the equivalents thereof.

What is claimed is:

1. A latching signal generator, comprising:
    a plurality of inputs configured to receive a clock signal, latch input data, and latch data, wherein the latch input data and the latch data are associated with a latch and wherein the latching signal generator is configured to provide a latching signal to the latch; and
    a determination circuit that is configured to cause latching signal generator to provide the latching signal based on the clock signal, in response to a determination that the input latch data is different than the latch data.

2. The latching signal generator of claim 1, wherein the determination circuit is further configured to cause latching signal generator to suppress the latching signal based on the clock signal, in response to a determination that the input latch data is the same as the latch data.

3. The latching signal generator of claim 1, wherein the determination circuit is further configured to cause latching signal generator to terminate the latching signal in response to determining that the input latch data is the same as the latch data.

4. The latching signal generator of claim 1, wherein the determination circuit comprises a plurality of transistors configured to couple an enable signal to a ground voltage based on a determination that the latch input data is the same as the latch data.

5. The latching signal generator of claim 1, further comprising an output, and wherein the output is coupled to a voltage based on the determination that the latch input data is the same as the latch output data.

6. The latching signal generator of claim 5, further comprising an inverted output, wherein the inverted output is configured to output the latching signal in response to receipt of the voltage.

7. A latching system, comprising:
    a latch for storing latch data, wherein the latch is configured to change state based on receipt of a latching signal; and
    a latching signal generator coupled to the latch, wherein the latching signal generator is configured to receive a clock signal and provide the latching signal to the latch during an active cycle of the clock signal based on a determination that the latch data is different than latch input data.

8. A latching system of claim 7, wherein the latching signal generator comprises:
    a signal module configured to provide the latching signal to the latch; and
    a determination circuit that is configured to cause the signal module to provide the latching signal during the active cycle of the clock signal.

9. The latching system of claim 7, wherein the latching signal generator is further configured to suppress the latching signal during another active cycle of the clock signal based on a determination that the latch data is equivalent to the latch input data.

10. The latching system of claim 7, wherein the latching signal generator is further configured to terminate the latching signal upon determination that the latch data is equivalent to the latch input data.

11. The latching system of claim 7, wherein the latching signal generator comprises a plurality of transistors configured to couple an enable signal to a ground voltage based on a determination that the latch data is the same as the latch input data.

12. The latching system of claim 7, wherein the latching signal generator comprises a plurality of transistors configured to suppress an enable signal based on a determination that the latch input data is the same as the stored data.

13. The latching system of claim 7, wherein the latching signal generator comprises a plurality of transistors configured to selectively couple an output of the latching signal generator to a ground voltage based on a determination that the latch input data is different than the stored data.

14. The latching system of claim 7, wherein a flip flop comprises the latching system.

15. The latching system of claim 7, wherein an integrated circuit comprises the latching system.

16. A method, comprising:
receiving, by a latching signal generator, a clock signal, latch input data, and latch data, wherein the latch input data is an input to a latch and the latch data is stored in the latch;
determining, by the latching signal generator and in response to the clock signal, whether to change a state of the latch based on the latch input data and the latch data; and
controlling, by the latching signal generator, the latch based on the determination.

17. The method of claim 16, wherein controlling the latch comprises transmitting at least one latching signal to the latch based on a determination that the latch input data is different than the latch data.

18. The method of claim 17, wherein controlling the latch comprises terminating the latching signal based on a determination that the latch input data is the same as the latch data.

19. The method of claim 16, wherein controlling the latch comprises suppressing a latching signal based on a determination that the latch input data is equivalent to the latch data.

20. The method of claim 16, wherein determining whether the latch input data is equivalent to the latch data comprises providing the latch input data and the latch data to a plurality of transistors, the transistors configured to couple an output of the latching signal generator to a ground in response to the latch input data being equal to the latch data.

* * * * *